(12) United States Patent
Spitz et al.

(10) Patent No.: US 8,937,128 B2
(45) Date of Patent: Jan. 20, 2015

(54) CURABLE REACTION RESIN SYSTEM

(75) Inventors: Richard Spitz, Reutlingen (DE); Irene Jennrich, Winnenden (DE); Hubert Zoller, Reutlingen (DE); Hans Staudenmaier, Waiblingen (DE)

(73) Assignee: Robert Bosch GmbH, Stuttgart (DE)

( * ) Notice: Subject to any disclaimer, the term of this patent is extended or adjusted under 35 U.S.C. 154(b) by 938 days.

(21) Appl. No.: 12/921,312

(22) PCT Filed: Jan. 22, 2009

(86) PCT No.: PCT/EP2009/050720
§ 371 (c)(1),
(2), (4) Date: Dec. 15, 2010

(87) PCT Pub. No.: WO2009/109413
PCT Pub. Date: Sep. 11, 2009

(65) Prior Publication Data
US 2011/0124811 A1     May 26, 2011

(30) Foreign Application Priority Data

Mar. 7, 2008 (DE) .......................... 10 2008 013 231

(51) Int. Cl.
  C08L 75/00   (2006.01)
  H01L 23/29   (2006.01)
  C08G 59/40   (2006.01)
  C08G 73/06   (2006.01)
  C08L 63/00   (2006.01)
  C08K 3/22    (2006.01)
  C08K 3/36    (2006.01)

(52) U.S. Cl.
  CPC .......... *H01L 23/293* (2013.01); *C08G 59/4014* (2013.01); *C08G 73/0655* (2013.01); *C08L 63/00* (2013.01); *H01L 23/296* (2013.01); *C08K 3/22* (2013.01); *C08K 3/36* (2013.01)
  USPC ......................................... 524/500

(58) Field of Classification Search
  USPC ........................................ 524/500
  See application file for complete search history.

(56) References Cited

U.S. PATENT DOCUMENTS

| | | | |
|---|---|---|---|
| 6,469,074 B1 * | 10/2002 | Hino et al. | 523/466 |
| 2005/0148695 A1 * | 7/2005 | Zhou et al. | 523/427 |
| 2007/0191513 A1 * | 8/2007 | Jenrich et al. | 523/443 |

FOREIGN PATENT DOCUMENTS

| | | |
|---|---|---|
| DE | 103 60 895 | 7/2004 |
| DE | 103 45 139 | 4/2005 |
| DE | 103 45 312 | 4/2005 |
| DE | 699 20 308 | 9/2009 |
| JP | 11171975 | 6/1999 |
| JP | 2001089654 | 4/2001 |
| JP | 2001-244387 | 9/2001 |
| JP | 2001-302767 | 10/2001 |
| JP | 2007-231213 | 9/2007 |

OTHER PUBLICATIONS

Definition of Combine found at http://www.thefreedictionary.com/combining on Dec. 24, 2013.*

* cited by examiner

*Primary Examiner* — Ling Choi
*Assistant Examiner* — Lanee Reuther
(74) *Attorney, Agent, or Firm* — Kenyon & Kenyon LLP

(57) ABSTRACT

A curable reaction resin system can be used for example as a casting compound, molding compound, or high-temperature resin, and is to be processed as a two-component compound. The system has a first reaction resin component and a second reaction resin component, the first reaction resin component being epoxy-free and realized on the basis of a cyanate ester.

12 Claims, No Drawings

CURABLE REACTION RESIN SYSTEM

FIELD OF THE INVENTION

The present invention relates to a curable reaction resin system, to the use thereof, and to a method for manufacturing components using the same.

BACKGROUND INFORMATION

Curable reaction resin systems are widely used in the manufacture of electronic or electrical components. Thus, for example electronic components are sheathed by highly filled reaction resin systems in order to effectively protect the component from environmental influences both during manufacture and during later operation. In addition, such reaction resin systems are used for the electrical insulation of electrical or electronic components such as ignition coils or power diodes. Up to now, in particular epoxy-based resin systems realized as one- or two-component systems have been used as reaction resin systems.

In addition, from German Patent Application No. DE 103 60 895 polymer compounds are known that are realized on the basis of a polycyanurate matrix and that additionally include filler material components as well as tougheners. As the miniaturization of electrical or electronic components progresses, during operation thereof there occur significantly higher thermal loads on the components and thus also on the resin systems provided therein. This results in a need for curable reaction resin systems that are stable at high temperatures.

SUMMARY OF THE INVENTION

The present invention is based on the object of providing a curable reaction resin system that has a sufficient electrical insulating effect while simultaneously having high temperature resistance, and that is nonetheless well-suited for processing.

According to the present invention, the underlying object of the present invention is achieved by the provision of a curable reaction resin system that can be used as a two-component system and whose design largely does without the use of epoxy resins. At least one of the resin components, and, in alternative specific embodiments, both resin components, of the two-component system are kept free of epoxy. In this way, significantly higher glass transition temperatures are achieved in comparison to previous epoxy resin compounds.

In particular, it is advantageous that the curable reaction resin system contains, as first reaction resin component, a dispersion of a so-called modifier or toughener in a resin system free of epoxy resin. Because the use of modifiers standardly takes place in the form of a dispersion containing the corresponding modifier and an epoxy resin, its provision in an epoxy-free resin based on a cyanate ester is an advantageous step towards higher glass transition temperatures of the cured reaction resin system.

In addition, it is advantageous if the first reaction resin component of the curable reaction resin system contains a filler material that is realized in particular in the form of amorphous silicon dioxide, possibly with the addition of aluminum oxide. In this way, a good insulating effect of the resulting reaction resin system is ensured. In addition, due to the low thermal expansion coefficient of the filler material, given strong heating there is only a relatively slight expansion of the resin system in the cured state.

According to a particularly advantageous specific embodiment, as the second reaction resin component a solution or dispersion of a curing catalyst with a suitable resin is provided. Here, nonylphenol, which is standardly used, is deliberately not used, because this substance is toxicologically critical.

During the processing of the reaction resin system according to the present invention, it is advantageous if before the actual processing this system is stored in the form of two separate resin components, and at least one of these resin components is stabilized at a pH value >7, i.e. in the basic range. This significantly increases the storage stability of the reaction resin components.

Furthermore, it is advantageous if the resin system is stored at a temperature <80° C., because in this temperature range only a slight increase in viscosity of the two resin components takes place, even over longer periods of time.

The described reaction resin system may advantageously be used for the manufacture of power diodes, semiconductor components, generators, ignition coils, hybrid inverters, and components for valves or electric motors.

DETAILED DESCRIPTION

A reaction resin system according to the present invention is preferably realized as a two-component system. This means that the reaction resin system includes two reaction resin components A1, A2 having different ingredients, the two reaction resin components being stored separately from one another and not being mixed with one another and processed until immediately before the actual processing or use of the reaction resin system. If the two components are mixed too soon, an undesired premature curing of the reaction resin system will result.

A first reaction resin component A1 includes for example three basic components, namely a resin component A, polymer particles C, and a filler material D, the addition of polymer particles C being optional and taking place depending on the application. In addition, standard additives such as antifoaming agents, sedimentation inhibitors, or adhesives may also be present.

First reaction resin component A1 is preferably realized so as to be free of epoxy resins, resin component A instead being selected to be a resin based on one or more cyanate esters. This polycyanurate matrix preferably includes monomers that contain phenyl groups, as well as multiple compounds containing cyanate ester groups.

Thus, for example, resins are suitable that are based on polyphenol cyanates, such as oligo(3-methylene-1,5-phenylenecyanate), as well as cyanate esters based on novolaks, cyanate esters based on 4,4 ethylidenediphenyldicyanate and based on ethylidene-bis-4,1-phenyldicyanate.

Reaction resin component A1 contains resin component A in a portion of 25 to 50 weight %, preferably 28 to 42 weight %, and in particular 27 to 35 weight %. As resin component A, cyanate esters realized solely on the basis of one of the named monomers may be considered; however, resin component A can also be formed from mixtures of the named monomers.

As a further component, reaction resin component A1 contains at least one modifier or toughener component C that prevents the reaction resin system from assuming a predominantly brittle character in the cured state. The toughener is in particular made up of polymers containing polysiloxane or silicones, which can be used for example in the form of a dispersion that contains the silicone particles and resin component A.

This dispersion can be produced in situ by first exposing an emulsion of a siloxane in a resin based on a cyanate ester to reaction resin component A1. In a following curing step of reaction resin component A1, in the presence of suitable additives, in particular catalysts, there are formed, inter alia, particles or nanoparticles of silicone that act as modifier C. These silicone particles can in principle have a chemically modified or surface.

Reaction resin component A1 contains for example 0.5 to 11 weight % of silicones or polysiloxanes, preferably 1 to 7 weight %, in particular 2 to 5 weight %.

In addition, reaction resin component A1 preferably contains a mineral filler material D, the suitable selection of which can reduce the shrinkage of the reaction resin system during curing, and which increases the thermal stability or electrical insulating effect of the cured reaction resin system. Examples of suitable filler materials include for example aluminum oxide, chalk, silicon carbide, boron nitride, talcum, silica dust, fused silica, or mixtures thereof. Particularly preferred is the use of aluminum oxide and fused silica as well as mixtures thereof, because in this way a particularly small expansion of the reaction resin system during curing can be achieved. Preferably, filler material D is realized in the form of amorphous silicon dioxide with addition of aluminum oxide. Filler material D can also be used in the form of nanoparticles.

The portion of filler material in reaction resin component A1 is for example 20 to 65 weight %, preferably 35 to 63 weight %, and in particular 51 to 61 weight %.

In the uncured state, the reaction resin system includes a further reaction resin component A2. This contains for example a catalyst B that is dispersed in a suitable additional resin component Aw. Transition metal complex compounds, such as copper acetyl acetonate, cobalt acetyl acetonate, or manganese acetyl acetonate may in particular be used as catalyst B.

For toxicological reasons, nonylphenol is not used as a bearer for the corresponding catalyst B. Instead, a highly purified epoxy resin, for example based on bisphenol F, or resin component A used in reaction resin component A1, i.e. cresylglycide, silanes, or mixtures of these resins, are used as resin component Aw of second reaction resin component A2.

The portion of catalyst B in further reaction resin component A2 is 0.1 to 10 weight %, preferably 0.3 to 8 weight %, in particular 0.4 to 5 weight %.

Reaction resin components A1, A2 are first produced as storage-stable pre-mixtures in a dissolver. A possible storage of reaction resin components A1, A2 preferably takes place at temperatures <80° C. in order to avoid premature increase of the viscosity of reaction resin components A1, A2. In addition, during the storing of reaction resin components A1, A2 the pH value of at least one reaction resin component A1, A2 is kept in the basic range, i.e. in a range >7. In addition, for long-term stabilization reaction resin components A1, A2 are kept free of liquid sedimentation inhibitors, and acidic filler materials are not added to them. In this case, surface-silanized filler material derivates are preferably used.

The reaction resin system is brought into a state ready for processing by mixing reaction resin components A1, A2. This is accomplished for example using a fully automatic two-component mixing/metering apparatus. Here a processing temperature of preferably 60-110° C. is maintained, because in particular reaction resin component A1 has a relatively high initial viscosity due to the high degree of filling. The mix ratio of the two reaction resin components A1:A2 is for example 100:0.5-100:10; 100: preferably 100:1-100:5, and in particular 100:1.5-100:2.5.

In the following, exemplary embodiments of reaction resin systems, or their composition in weight percent, and the resulting profile of properties in the cured state are given as examples.

|  | Exemplary embodiment 1 | Exemplary embodiment 2 | Exemplary embodiment 3 | Exemplary embodiment 4 | Exemplary embodiment 5 | Exemplary embodiment 6 | Exemplary embodiment 7 |
|---|---|---|---|---|---|---|---|
| Reaction resin component A1 | | | | | | | |
| Resin component A | Cyanate ester based on novolak | Oligo(3-methylene-1,5-phenylene-cyanate + 4,4 ethylidene diphenyl dicyanate | Oligo(3-methylene-1,5-phenylene-cyanate + ethylidene-bis-4,1 phenyl dicyanate | Oligo(3-methylene-1,5-phenylene-cyanate | Oligo(3-methylene-1,5-phenylene-cyanate | Oligo(3-methylene-1,5-phenylene-cyanate + ethylidene-bis-4,1 phenyl dicyanate) | Oligo(3-methylene-1,5-phenylene-cyanate |
| Resin portion | 34% | 29% + 5.1% Σ = 34.1% | 28.8% + 3.2% Σ = 32% | 27.4% | 27.3% | 26.94% + 1.35% = 28.29% | 34% |
| Modifier | — | — | — | 2.5% silicone in 3.8% resin (4,4 ethylidene-diphenyl-dicyanate) | 2.7% silicone in 4.1% resin (4,4 ethylidene-diphenyl-dicyanate) | 2.7% silicone in 4.04% resin (ethylidene-bis-4,1-phenyl dicyanate) | — |
| Additives | 1.3% | 1.3% | 1.3% | 1.4% | 1.4% | 1.34% | 1.4% |
| Amorphous $SiO_2$ | 58.1% | 57.6% | 60.5% | 58% | 57.7% | 56.9% | 58% |
| $Al_2O_3$ | 6.6% | 7% | 6.2% | 6.9% | 6.8% | 6.73% | 6.6% |

| Reaction resin component A2 |
|---|
| Catalyst 0.7% mixture of Cu or Co acetylacetonates in epoxy resin based on bisphenol F |

In all the named exemplary embodiments, the mixture ratio of reaction resin component A1 to reaction resin component A2 is A1/A2=100/2 by weight.

The above-named compositions yield the following property profiles:

| Exemplary embodiment | $\alpha^1$ 10-6/ °C. | Tg °C. | Shrinkage % | Break stress$^2$ N/mm$^2$ | Breaking elongation$^2$ % |
|---|---|---|---|---|---|
| 1 | 22 to 260° C. | 280 | | 106 | 0.8 |
| 2 | 22 to 254° C. | 286 | 0.6 | 101/51 | 0.82/0.38 |
| 3 | 25 to 265° C. | 265 | 0.45 | 109/49 | 0.87/0.34 |
| 4 | 28 to 248° C. | 271 | 0.4 | 98/49 | 0.96/0.4 |
| 6 | 28 to 245° C. | 273 | 0.1 | 96/39 | 0.9/0.3 |
| 7 | 26 to 223° C. | 250 | | 119 | 0.97/0.3 |

$^1$thermal coefficient of expansion
$^2$bending or tensile trials

Due to its thermal stability in the cured state, the reaction resin system is suitable above all for components that are at times exposed to temperatures of over 270° C.

For example, the reaction resin system according to the present invention can be used for the manufacture of casting compounds for power diodes, generators, hybrid inverters or ignition coils, glob tops, underfillers, molding compounds, or high-temperature adhesives for semiconductor components, or for the manufacture of media-resistant protective and barrier layers for semiconductors, silicon chips, flip-chip supports, or airtight assemblies, as well as for the manufacture of components for valves or electric motors.

What is claimed is:

1. A two-component curable reaction resin system, that is adapted to be stored separately to prevent premature curing prior to processing, the system comprising:

a first reaction resin component, the first reaction resin component being epoxy-free and including a cyanate ester; and a second reaction resin component;

wherein at least one of the first and second reaction resin components is stored at a basic pH value.

2. The reaction resin system according to claim 1, wherein the system is a casting compound, a molding compound, or a high-temperature resin.

3. The reaction resin system according to claim 1, wherein the first reaction resin component contains a modifier based on a silicone or siloxane.

4. The reaction resin system according to claim 3, wherein the modifier is present in the form of an emulsion of siloxanes in a resin based on a cyanate ester.

5. The reaction resin system according to claim 1, wherein the first reaction resin component contains a filler material.

6. The reaction resin system according to claim 5, wherein the filler material contains at least one of (a) amorphous silicon dioxide and (b) aluminum oxide.

7. The reaction resin system according to claim 1, wherein the second reaction resin component contains a curing catalyst.

8. The reaction resin system according to claim 1, wherein the second reaction resin component contains an epoxy resin on the basis of bisphenol, a silane, or a cresylglycide.

9. The reaction resin system according to claim 1, wherein the system is used for a manufacture of power diodes, semiconductor components, generators, ignition coils, hybrid inverters, or components for valves or electric motors.

10. The reaction resin system according to claim 1, wherein the second reaction resin component comprises an epoxy resin, wherein the epoxy resin is present in an amount of less than 3.5 weight % of the curable reaction resin system.

11. The cured reaction resin system according to claim 10, wherein the two-component compound is one of an insulating compound, a glob top, an underfiller, and a protective layer.

12. The cured reaction resin system according to claim 10, wherein the system contains one of silicone and polysiloxane elastomer particles as a modifier.

* * * * *